United States Patent [19]

Hanak

[11] Patent Number: 4,556,788
[45] Date of Patent: Dec. 3, 1985

[54] AMORPHOUS SILICON CELL ARRAY POWERED SOLAR TRACKING APPARATUS

[75] Inventor: Joseph J. Hanak, Lawrenceville, N.J.

[73] Assignee: RCA Corporation, Princeton, N.J.

[21] Appl. No.: 552,726

[22] Filed: Nov. 17, 1983

[51] Int. Cl.$^4$ .............................................. G01J 1/20
[52] U.S. Cl. ............................ 250/203 R; 126/425
[58] Field of Search ............... 250/203, 208, 209, 212; 126/425; 136/258

[56] References Cited

U.S. PATENT DOCUMENTS

| | | | |
|---|---|---|---|
| 3,435,246 | 3/1969 | Webb | 250/237 |
| 3,917,942 | 11/1975 | McCay | 250/203 |
| 3,996,460 | 12/1976 | Smith | 250/203 |
| 4,013,885 | 3/1977 | Blitz | 250/203 |
| 4,041,307 | 8/1977 | Napoli et al. | 250/203 |
| 4,107,521 | 8/1978 | Winders | 250/203 |
| 4,151,408 | 4/1979 | Brown et al. | 250/203 |
| 4,190,766 | 2/1980 | Young | 250/203 |
| 4,223,214 | 9/1980 | Dorian et al. | 250/203 |
| 4,290,411 | 9/1981 | Russell | 126/425 |
| 4,314,546 | 2/1982 | Miller | 126/425 |

OTHER PUBLICATIONS

"Monolithic Solar Cell Panel of Amorphous Silicon," by J. J. Hanak, *Solar Energy*, vol. 23, 1979, pp. 145–147.
"Industrialization of a—Si Photovoltaic Cells," by Yukinori Kuwano et al., Solar Energy Research Institute, Amorphous Silicon Material Meeting, Atlantic City, Nov. 23–25, 1981.

*Primary Examiner*—David C. Nelms
*Attorney, Agent, or Firm*—Joseph S. Tripoli; George E. Haas; William Squire

[57] ABSTRACT

An array of an even number of amorphous silicon solar cells are serially connected between first and second terminals of opposite polarity. The terminals are connected to one input terminal of a DC motor whose other input terminal is connected to the mid-cell of the serial array. Vane elements are adjacent the end cells to selectively shadow one or the other of the end cells when the array is oriented from a desired attitude relative to the sun. The shadowing of one cell of a group of cells on one side of the mid-cell reduces the power of that group substantially so that full power from the group of cells on the other side of the mid-cell drives the motor to reorient the array to the desired attitude. The cell groups each have a full power output at the power rating of the motor. When the array is at the desired attitude the power output of the two groups of cells balances due to their opposite polarity so that the motor remains unpowered.

6 Claims, 4 Drawing Figures

AMORPHOUS SILICON CELL ARRAY POWERED SOLAR TRACKING APPARATUS

The Government has rights in this invention pursuant to Subcontract No. ZE-2-02044-01 under Contract No. EG-77-C-01-4042 awarded by the Department of Energy.

This invention relates to apparatus for tracking incident visible radiation.

Systems for tracking incident visible radiation, for example, for tracking incident solar radiation during the diurnal cycle, are well known. By way of example, one such tracking system is disclosed in U.S. Pat. No. 4,041,307. Disclosed in this patent is a system in which a platform rotates about two axes in response to signals from a photosensing unit comprised of four photocells, generally of crystalline silicon, which provide a signal directly related to the quantity of received light. The photocells are arranged in two pairs disposed substantially along first and second orthogonal lines, respectively, on the surface. The first line is the projection of a first axis upon the surface; the second line is parallel to the second axis.

When the platform is in its desired attitude, all of the photocells provide signals with substantially equal amplitude. In response to one of the pairs of the photocells providing a pair of signals of unequal amplitude to the inputs of a differential amplifier, the amplifier provides a given output signal. The output signal causes a motor to rotate the platform about a corresponding one of the axes in a direction that causes a reduction of the difference between the amplitudes of the signals, whereby the platform is substantially maintained in the desired attitude. Such platforms are maintained in the desired attitude to maximize the amount of incident solar energy. The platform is therefore moved during the diurnal cycle to maintain that maximum incident solar energy.

Solar cells employed in prior art tracking systems are often used with shading systems to increase the system accuracy. Such shading systems include the opaque, open-ended cylindrical tube of the aforementioned patent, a box such as shown in U.S. Pat. No. 3,996,460, or vanes as disclosed in U.S. Pat. No. 4,314,546. In any case, the shading system enhances the unequal amounts of incident solar radiation on the different solar cells when the cells are not in the desired attitude, causing a differential in the amplitudes of the signals produced by those solar cells. The resulting tracking system then analyzes or responds to the difference in amplitude of the outputs of the different solar cells to provide a servo-motor operating system which tends to return the system in a direction to equalize the signal amplitudes and thus maximize the incident solar radiation.

The amorphous silicon (a—Si) photocell is of recent development. Amorphous silicon solar cells are the object of much recent research and development because of their significantly lower manufacturing cost and higher efficiency than the prior art crystalline silicon solar cells. For example, reference is made to "Industrialization of a—Si Photovoltaic Cells," by Yukinori Kuwano et al., Solar Energy Research Institute, Amorphous Silicon Material Meeting, Atlantic City, Nov. 23-25, 1981. This report discusses fabrication properties, characteristics, and applications of a—Si solar cells. The a—Si solar cells have relatively good conversion efficiency, for example, 6.91% as disclosed in the aforementioned article. Amorphous silicon solar cells also tend to exhibit extremely high resistance when nonconductive, i.e., when shadowed, as compared to crystalline cells.

Generally, fabrication procedures are cumbersome for series connected crystalline silicon cells. However, a—Si solar cells are more readily adapted to series connected systems. Reference is made to "Monolithic Solar Cell Panel of Amorphous Silicon," by J. J. Hanak, *Solar Energy*, Volume 23, pp. 145-147, 1979 which discloses in FIG. 1 thereof a schematic diagram of a monolithic solar cell panel of a—Si:H. As disclosed therein, unlike individual cells, the series connected cells have no basic total size limitation. A simple expression is discussed therein for the maximum width of the individual strip cells in terms of cell parameters. The article states that a reduction of wasted cell area has been realized by the elimination of current collecting grids from about ten to about one percent. The article goes on, stating arbitrarily high voltages can be obtained by subdividing the active layers into the appropriate number of series connected cells. The high voltage, low current combination not only helps to circumvent the problem of high series resistance due to the front transparent electrode of the system, but also provides electrical power at a voltage suitable for a particular load and in a form appropriate for distribution over long distances.

According to the article, "In spite of the relatively long history of the monolithic series-connected cell (9 yr), accounts of the fabrication of performance of actual devices are rare or lacking." In any case, as discussed in the Kuwano et al. article, a—Si solar cells are used for power applications to provide a relatively low cost source of electrical power for such appliances as watches, radios, calculators, and others.

According to an embodiment of the present invention, a solar tracking apparatus comprises a plurality of a—Si solar cells serially connected in an array between first and second end cells. Means are provided for dividing the array into at least first and second groups of cells which, when fully illuminated in a reference orientation relative to the sun, have approximately zero net output voltage. When at least one cell of one or the other of the groups is shadowed, the cells of the other unshadowed group produce an operating output voltage having a given polarity. The given polarity is of one sense for one group of cells and a second opposite sense for the other group of cells. Means are adjacent the array for shadowing at least one cell of the one or other groups when the cells are in an orientation different from the reference orientation. Motor means are responsive to the operating output voltage for operating in a direction corresponding to the sense of the operating output voltage. Means coupling the motor means to the array are arranged such that the array tends to be returned to the reference orientation by the operation of the motor means when in the different orientation.

Figure 1:
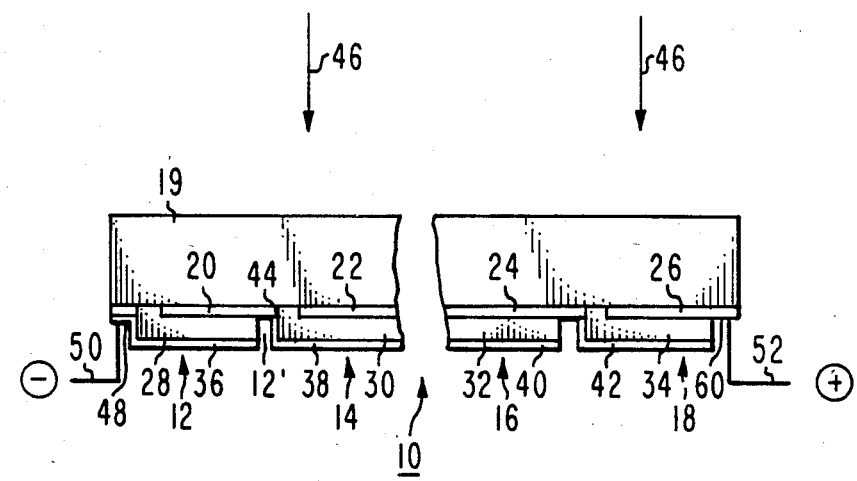
FIG. 1 is a fragmented end elevation view of a series connected monolithic solar cell panel of amorphous silicon.

The monolithic solar cell panel (MSCP) device 10 of FIG. 1 is made of amorphous silicon (a—Si:H) and has been described in the literature, for example, in the aforementioned Hanak article which is incorporated by reference herein. The MSCP device 10 of FIG. 1 is a photovoltaic device comprising two or more solar cells such as cells 12, 14, 16, and 18. In practice, there may be more or fewer cells than the four cells of FIG. 1, and generally an even number of cells are used in a solar tracking system. The cells 12, 14, 16, and 18 are in the shape of long and narrow strips of equal width and length, fabricated parallel to each other on a single transparent substrate 19 which may be glass and electrically connected in series. The MSCP device 10 generates a photovoltage equal to the sum of the voltages of all of the cells of device 10 at a photocurrent approximately equal to the current generated by a single cell, assuming all cells are of the same width (left to right in the drawing).

The substrate 19, which may be float glass, is coated with a plurality of spaced coplanar layers of transparent, conductive oxide (TCO) front electrodes 20, 22, 24, and 26 corresponding, respectively, to cells 12, 14, 16, and 18. The TCO may be an indium tin oxide. The TCO is divided into long, narrow, parallel strips, each forming a respective front electrode of the individual cells. The front electrodes 20, 22, 24, and 26 are separated by gaps such as gap 12' which are as narrow as possible to minimize the inactive area of the combined structure. The active a—Si:H cell materials are deposited over the electrodes 20, 22, 24, and 26 in the form of layers 28, 30, 32, and 34. These active layers are described more fully in the aforementioned Hanak article. A portion of each of the active cell layers is in direct contact with the glass substrate 19 with a major portion of their broad surfaces in contact with the corresponding TCO electrodes, as shown. A portion of each TCO electrode is exposed and not covered by layers 28, 30, 32, and 34 as at shoulder 44.

Back metallic electrodes 36, 38, 40, and 42 are deposited over the respective active layers 28, 30, 32, and 34 and over the exposed shoulder portions of the TCO electrodes, such as at shoulder 44, to form an interconnection between the back electrode of one cell, such as electrode 38 of cell 14, and the front electrode of the adjacent cell, such as electrode 20 of cell 12. Photolithographic techniques may be used in the fabrication of device 10.

The front electrodes 20, 22, 24, and 26 are transparent so that the light rays 46 pass through the transparent substrate 19 and the front electrodes and impinge upon the active a—Si:H of layers 28, 30, 32, and 34 of the respective cells. Back metallic electrode 36 of end cell 12 has a shoulder forming a negative terminal 48 to which a wire 50 is ohmically connected, e.g., by soldering. TCO electrode 26 at the other end of the device 10 has a wire 52 connected thereto at a shoulder forming a positive terminal 60. The device 10 of FIG. 1 thus comprises a set of cells 12, 14, 16, and 18 serially connected to provide an output voltage between wires 50 and 52 which is equal to the sum of the voltages across each cell and has a current equivalent to the current through one cell.

Figure 2:
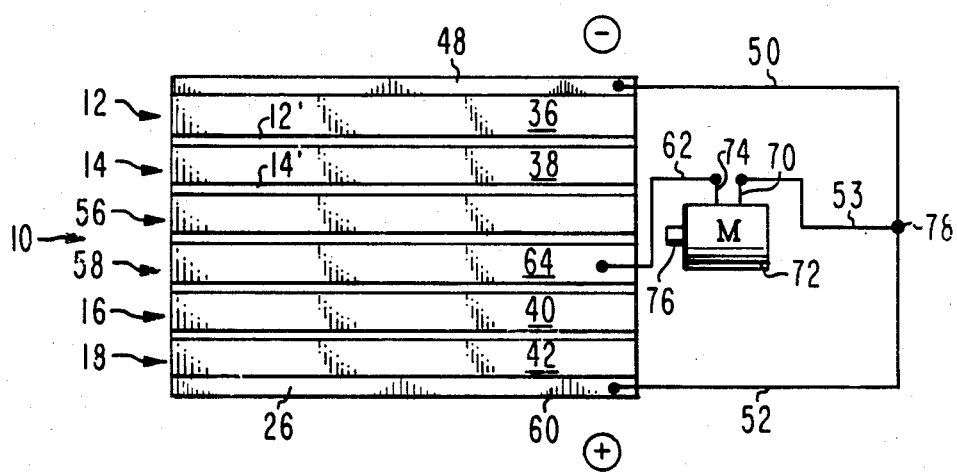
FIG. 2 is a bottom view of a monolithic solar cell panel and a schematic diagram of a motor coupled to the panel.

In FIG. 2, the MSCP device 10 comprises six cells, including cells 12, 14, 16, and 18 described above and additional similar cells 56 and 58, which form a completed series connected monolithic solar cell panel. Cell 12 is separated from cell 14 by gap 12', and cell 14 is separated from cell 56 by gap 14'. The remaining cells are separated by similar gaps. In FIG. 2, each cell comprises a relatively long strip isolated from the next adjacent cell by the corresponding gap and connected in series by the respective electrodes, as discussed above. A lead 62 is connected to back electrode 64 of cell 58. Lead 62 is thus coupled to the midpoint of the MSCP device 10 so that there are an equal number of active cell layers between the terminal 48 of cell 12 and the terminal 60 of cell 18. In this case there are three cells forming one cell group on the positive side of lead 62 and three cells in a second cell group on the negative side of lead 62.

Leads 50 and 52 are connected at junction 78 to one input terminal 70 of DC motor 72 via lead 53. Lead 62 is connected to the other input terminal 74 of DC motor 72. Motor 72 is one which reverses direction of rotation when the polarity of the applied voltage between terminal 70, 74 is reversed. In addition, the voltage and power rating of the motor 72 is approximately matched to the output of three of the cells of the MSCP 10, i.e., the output of the cells between leads 62 and 50 or leads 62 and 52. The reason for this is that the voltage and power available for those three cells should be sufficient to drive the motor 72 shaft 76 at full power in the presence of maximum incident light.

The system of FIG. 2 has certain unique characteristics. When the cells of MSCP device 10 are illuminated equally, both groups of three cells between leads 62 and the positive and negative terminals have similar voltage and power output, producing zero current through the motor 72.

However, the a—Si:H material comprising each of the cells of the MSCP device 10, when in shade, are insulators and have an extremely high resistance. Because of the series connections of the three cells of a given group, for example, the group between leads 62 and 50 or the group between leads 62 and 52, if any one or a portion of one of the cells 12, 14, 56 of one group or cells 58, 16, or 18 of the other group is completely in shadow for the full length of that cell from the left to right of the drawing FIG. 2, then that cell in shadow will have a sufficiently high resistance so that that group appears as an open circuit between the corresponding leads 62, 50 or 62, 52 coupled to that group of cells, i.e., negligible current flows.

Because of this open nature of the shadowing effect of a given cell or portion thereof, the other group of cells provides full power because none of those cells are in shade. By way of example, assuming the cell 18 or portion thereof is fully in shadow along the length of that cell, then there is relatively negligible power supplied between leads 62, 52. However, the cells 12, 14, and 56 between leads 50, 62 will have full power because none of those cells are in shade and the full power of those three cells will be applied to leads 50, 62 and to the input terminals 70, 74, respectively, of motor 72. As described above, those three cells provide full power to the motor 72. While some voltage may appear across the shadowed group of cells, negligible current flows due to the high resistance of the shadowed cell.

This is to be compared to prior art non-monolithic cell structures comprising crystalline solar cells of prior designs. In those cases, a cell when shaded, still exhibits some conductivity and therefore has a relatively low resistance. It also may generate some power even though partially shaded. Such cells, when connected as shown in FIG. 2, would ordinarily not generate sufficient power to drive motor 72 in the presence of shading of one or more cells of a group. This is due to the cancelling affect of the power generated by the two groups of crystalline cells.

Figure 3:
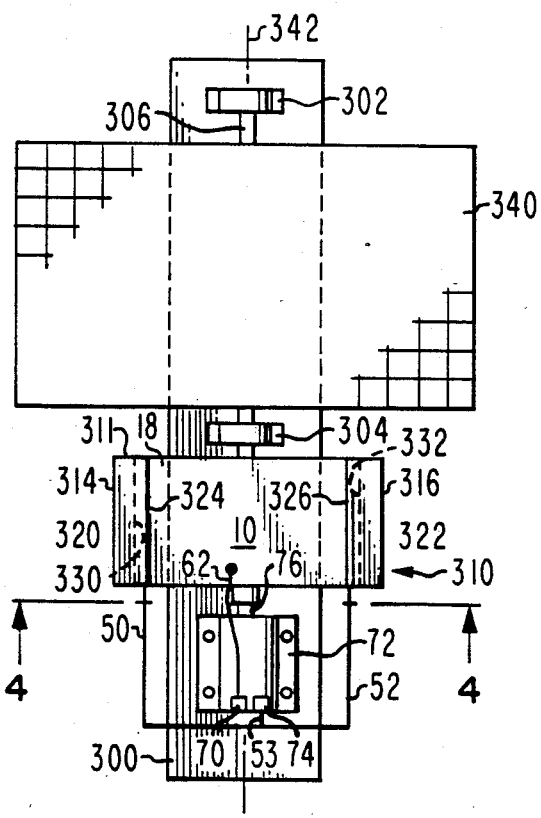
FIG. 3 is a plan view of a system including the structure of FIG. 2 according to one embodiment of the invention.
Figure 4:
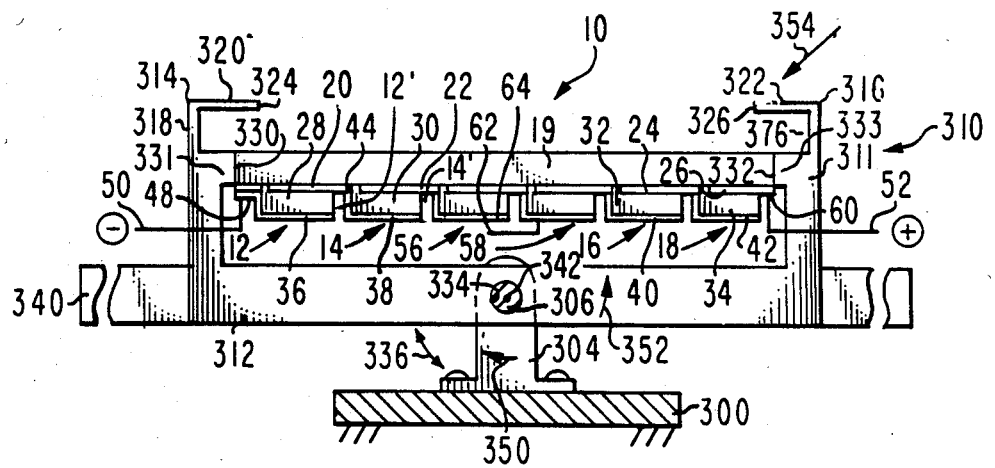
FIG. 4 is an end elevation section view through the embodiment of FIG. 3 taken along lines 4—4.

In FIGS. 3 and 4, apparatus 310 includes MSCP device 10 and a MSCP device 10 support structure 311. The support structure 311 comprises a base plate 312, FIG. 4, and two upstanding L-shaped vane elements 314 and 316. Vane element 314 includes an upstanding leg 318 and a shadowing leg 320 normal to leg 318 at its extended edge and parallel to the plane of the device 10. Vane element 316 is a mirror image of the vane element 314 and includes a shadowing leg 322 lying in the same plane as leg 320. Legs 320 and 322 extend the full length of the device 10, FIG. 3, parallel to the cell lengths in a direction from the bottom to the top of the drawing. The facing edges 324, 326 of shadowing legs 320 and 322, respectively, are vertically above the outer edges of terminals 48 and 60, respectively so that light rays perpendicular to device 10 are fully incident upon all cells. The vane elements 314 and 316 could also, in the alternative, be vertically oriented sheet members or other vane shadowing devices. The substrate 19 is bonded or otherwise secured at its edges to inside parallel surfaces 330, 332 of inwardly extending lips 331, 333, respectively, of structure 311. Device 10 can be attached to structure 311 in other ways, in the alternative.

The base plate 312 of apparatus 310 has a central bore 334, FIG. 4, through which shaft 306 passes and to which structure 311 is fastened. Rotation of the shaft 306 in directions 336, FIG. 4, rotates the base plate 312 about shaft axis 342 and thus apparatus 310 and the MSCP device 10 in directions 336. Shaft 306 is connected to DC motor 72 shaft 76 and is driven by the motor. Shaft 76 may be coupled to motor 72 through a reduction gear train (not shown). Shaft 306 is supported by bearings 302 and 304 secured to support 300. Motor 72 is also secured to support 300. Support 300 could also be rotatably mounted and driven by a second tracking system (not shown) for rotation about a seasonal axis normal to axis 342 for tracking the sun during the seasonal cycle. The second seasonal tracking system may be constructed similar to the system of FIGS. 3 and 4 which rotates shaft 306 to track the sun in the seasonal cycle.

Also secured to the shaft 306 is panel 340 which is desired to be aimed at incident sunlight during the diurnal cycle and which incident sunlight is to be maximized. The plane of the panel 340, which may be a panel of solar cells or a heat collecting system, should be perpendicular to the rays of incident sunlight throughout the diurnal cycle. To this extent, the panel 340 is required to be rotated about the diurnal axis 342 through the center of shaft 306 parallel to its long axis. In FIG. 4, the panel 340 is rotated in direction 350, for example, to be normal to the sun rays during early morning hours and is rotated in direction 352 to follow the sun's path through the sky until the sun sets in the west.

In operation, assuming that the apparatus 310, FIG. 4, and the MSCP device 10 and the panel 340 can be driven by the motor 72, FIG. 3, with the power supplied by cells 12, 14, 56 of one group, or cells 58, 16, 18 of the other group of the MSCP device 10. In FIG. 4, rays 354 of light are incident upon leg 322 of the vane 316 shadowing cell 18. Because the cell 18 is an insulator when not illuminated, it exhibits an extremely high resistance, as discussed above, and negligible power flows between leads 52 and 62. However, the cells 12, 14, and 56 receive full sunlight and, therefore, provide full power between leads 50 and 62 to the DC motor 72, FIG. 3. This power is supplied to the input leads 70, 74 of motor 72 in a way that causes the shafts 76 and 306 to rotate in direction 350, FIG. 4, until the cell 18 is in full sunlight. Because the leg 322, edge 326 is parallel to cell 18, when a shadow produced by leg 322 is over a portion of the cell 18, that shadow extends for the full length of the cell 18 parallel to its electrodes 26 and 42, FIG. 1. That shadowing effect is sufficient to reduce the power from all three of the cells in that group of cells to a negligible value. It is that negligible power from this group of cells which permits the full power on the group of cells on the other half of the MSCP device 10 to drive the motor 72 at full power.

The motor being driven in direction 350 continues to be driven until the shadow 376 no longer is in contact with any portion of the cell 18. At that point, the power from the positive group of cells substantially equals the power from the negative group of cells and the motor 72 is no longer driven.

Should the shadowing occur on the opposite group of cells, for example, over cell 12, then the polarity of the resulting voltage will reverse and the direction of the rotation of the shaft of motor 72 will reverse. In that case, the motor shaft 76 will be driven in direction 352, FIG. 4. In other words, the shading of cell 18 causes the motor 72 to rotate in one direction and the shading of the cell 12 causes the motor to rotate in the opposite direction.

What is claimed is:

1. A solar tracking apparatus tiltable about a diurnal axis comprising:

a plurality of amorphous silicon solar cells serially connected in an array between first and second end cells;

a direct current motor having a pair of input terminals, the motor having a shaft tending to rotate in first and second opposite directions corresponding to the polarity of the direct current voltage applied to said input terminals, said cells being coupled to said shaft for rotation in response to the shaft rotation;

means for ohmically connecting said end cells to one of said input terminals and for ohmically connecting a cell central to said array to the other of said input terminals such that the cells between said central cell and said end cells form first and second cell groups, the voltage across said cell groups tending to be the same in magnitude and opposite in polarity when said cells are all fully illuminated in a reference orientation relative to the sun and of different magnitudes and opposite in polarity when at least one cell of one group is shadowed in an orientation different from said reference orientation;

said motor being responsive to the net voltage and its polarity generated by the cell groups and applied to said input terminals for rotating in a direction corresponding to the net voltage polarity; and means adjacent said array for shadowing said at least one cell of said one group when said cells are in said different orientation, the polarity of the net voltage of said groups of cells being such that the net voltage tends to cause said motor to return said cells to said reference orientation.

2. The apparatus of claim 1 wherein said cells comprise a plurality of parallel spaced strips of amorphous silicon secured to a light transparent medium.

3. The apparatus of claim 1 wherein said shadowing means includes means adjacent said end cells for selectively shadowing one or the other of said end cells when said cells are in said different orientation.

4. The apparatus of claim 1 wherein said array comprises a plurality of coplanar cells, said shadowing means including an opaque planar member adjacent each end cell lying in a plane parallel to the plane of said cells.

5. The apparatus of claim 1 wherein said array comprises an even number of cells.

6. A solar tracking apparatus comprising:
   a plurality of amorphous silicon solar cells serially connected in an array between first and second end cells;
   means for dividing said array into at least first and second groups of cells which when fully illuminated in a reference orientation relative to the sun have approximately zero net output voltage, and when at least one cell of one or the other of said groups is shadowed, the cells of the other unshadowed group produces an operating output voltage having a given polarity;
   said given polarity being of one sense for one group of cells and a second opposite sense for the other group of cells;
   means adjacent said array for shadowing said at least one cell of said one or other groups when said cells are in one orientation different than said reference orientation;
   a motor responsive to said operating output voltage for operating in a direction corresponding to the sense of said operating output voltage; and
   means coupling said motor to said array arranged such that said array tends to be returned to said reference orientation by the operation of said motor when in said different orientation.

* * * * *